United States Patent [19]

Luther

[11] 3,996,516
[45] Dec. 7, 1976

[54] APPARATUS AND PROCESS FOR TESTING PRINTED CIRCUITS

[75] Inventor: Erich Luther, Hannover-Ihme, Germany

[73] Assignee: LM-Electronic Luther & Maelzer, Hannover-Ihme, Germany

[22] Filed: Aug. 23, 1974

[21] Appl. No.: 499,904

[30] Foreign Application Priority Data
Aug. 23, 1973    Germany ........................ 2344239

[52] U.S. Cl. .......................... 324/158 F; 324/72.5; 324/158 P
[51] Int. Cl.² ..................... G01R 1/06; G01R 31/02
[58] Field of Search ............ 324/158 F, 158 P, 72.5

[56] References Cited
UNITED STATES PATENTS

| | | | |
|---|---|---|---|
| 2,918,648 | 12/1959 | Ludman et al. | 324/158 P |
| 3,453,545 | 7/1969 | Oates | 324/72.5 |
| 3,500,192 | 3/1970 | Donaher et al. | 324/72.5 |

*Primary Examiner*—R. V. Rolinec
*Assistant Examiner*—Ernest F. Karlsen
*Attorney, Agent, or Firm*—Edmund M. Jaskiewicz

[57] ABSTRACT

A printed circuit having a protective coating of lacquer or the like thereover is tested by bringing a plurality of resiliently mounted measuring pins into engagement with certain measuring points on the printed circuit. The printed circuit is then subjected to ultrasonic vibrations to cause the contacting pins to be impacted into good electrical contact with the measuring points on the printed circuit. The pins are resiliently mounted for axial movement in opposed openings in a pair of spaced plates and the plate and pin assembly is capable of being moved toward and away from the printed circuit.

3 Claims, 4 Drawing Figures

APPARATUS AND PROCESS FOR TESTING PRINTED CIRCUITS

The present invention relates to the testing of printed circuits, more particularly, to an apparatus and process for testing printed circuits by establishing momentary electric contact with measuring points on the circuit.

Various procedures and processes have been devised for the testing of printed circuits. One such procedure is visual whereby a person carefully inspects the conductor paths. It is apparent, however, that this procedure is disadvantageous in that the results of the testing are largely dependent upon the ability of the human doing the testing. Further, when a printed circuit comprises a dense and complicated pattern of conductor paths an extremely high degree of concentration is demanded from the inspector, since experience has shown a high density of conductor paths results in a correspondingly high increase in the frequency of defects or errors. In addition, the conductor paths may include defects that cannot be readily detected by the human eye. Such defects may comprise hair-line cracks, copper filaments and extremely fine fractures or breaks in the conductor paths.

Electrical testing procedures to determine the operational capacity of a printed circuit have been proposed wherein the circuits are placed on a surface and then pressed against electrically conducting pins at certain predetermined measuring points in order to close the operational circuit. In order to obtain the good electrical contact required for successful testing the printed circuits must be tested prior to the application thereon of a protective coating, such as lacquer. However, in a mass production operation such a testing operation constitutes an interruption in the production process which is disadvantageous in that the cost of the process is substantially increased. The manufacturing process may be such that the printed circuits can only be tested after the completed circuit boards have been coated with lacquer or with some other protective coating and have passed through the entire sequence of manufacturing steps. Under such circumstances, the protective coating must be penetrated. This requires a relatively high static pressure in order to produce a good electrical contact between the measuring pin and the measuring point in the printed circuit. The degree of pressure to which the printed circuit can be subjected is limited by the structure of the circuit and other practical considerations encountered in the manufacturing process.

In order to prevent any adverse effects on the printed circuit in those areas where the printed circuit board is contacted by the pins, a pessure of about 1 kp per pin is required. Thus, where a printed circuit is to be contacted by a minimum of about 500 measuring pins this means that forces of about 500 kp occur in the measuring table upon which the printed circuit board is positioned. However, it has been found that even with these relatively high pressures a desired high reliability rate of testing is not obtained As a result, a rather high rate of printed circuits are passed which actually incorporate defects.

In addition, the electrical conductivity at the points of contact of the measuring pins with the measuring points on the printed circuits is reduced substantially by various chemical reactions, such as by the formation of oxides. Therefore, it sometimes occurs that when a good electrical contact is established by means of a relatively high static pressure an increased resistance to electrical conductivity is obtained because of these chemical reactions. As a result, good conductivity will occur purely accidentially at those contact points where the surfaces possess scratches or other traces of external effects.

In addition, when the measuring pins are positioned by means of static pressure on the measuring points of the printed circuits to be tested, the presence of non-conducting material such as flux, lacquer, dust, residues of punching operations or the like wll oppose making good contact. Such impurities can be eliminated somewhat through the application of static pressure but here again a reliable and good electrical contact cannot be guaranteed.

It has also been proposed to plate the conductors and measuring points on the printed circuit with tin or gold in order to provide good electrical contact with the measuring pins. However, such a process is too expensive for only a single testing operation and is particularly uneconomical for use in mass production operations, such as in radio and television sets.

It has further been proposed to test miniaturized components by the effect of electromagnetic oscillation, such as in U.S. Pat. No. 3,453,545. In this patent, the contacts are in the form of beak or hook-shaped tips which are energized and actuated electromagnetically by means of levers associated singly with the measuring tips. However, this testing procedure has the disadvantage that it can only be used on relatively low density printed circuits because of the cumbersome and extensive structure required for this arrangement. Further, this oscillation system has an upper limit frequency at which the efficiency of transmission of energy is progressively attenuated as the frequency increases. The system is not suitable precisely at that point where better acceleration values should be obtained with increasing frequencies while assuming that the amplitude of oscillation remains the same. Further, electromagnetic oscillations do not guarantee reliable electric contact under the usual testing conditions wherein one must make simultaneously a relatively unlimited number of contacts of short duration and where good electrical contact is hindered by the presence of lacquer or oxide layers as well as impurities up to 100 microns.

It is therefore the principal object of the present invention to provide a novel and improved apparatus and process for the testing of printed circuits.

It is another object of the present invention to provide such a testing apparatus and process which is simple in construction and operation and which reduces substantially the costs of testing and of manufacturing the printed circuits.

It is a further object of the present invention to provide an apparatus and process for testing printed circuits wherein high quality electrical contact is reliably established between the measuring points and the printed circuit while subjecting the individual measuring pins to the lowest possible static pressure.

According to one aspect of the present invention an apparatus for testing printed circuits may comprise spaced guide plate means with opposed openings therethrough and a plurality of measuring pins resiliently mounted in the openings so as to be capable of axial movement therein. The pins have tips which are engageable with predetermined measuring points on the printed circuit. Means are further provided for supporting the printed circuit to be tested so that the circuit can be engaged by the tips of the pins. Means are also provided for subjecting the printed circuit to ultrasonic vibrations so that the tips of the pins which are resiliently urged against the printed circuit are brought into good electrical contact with measuring points on the printed circuit which are to be tested.

A process for testing printed circuits by bringing measuring pins into momentary electrical contact with measuring points on a printed circuit having a protective coating thereon may comprise the steps of positioning a plurality of resiliently mounted measuring pins into contact with measuring points on a printed circuit to be tested. The printed circuit is then subjected to ultrasonic vibrations so that the measuring pins are impacted into good electrical contact with the measuring points on the printed circuit.

Other objects and advantages of the present invention will be apparent upon reference to the accompanying description when taken in conjunction with the following drawings, which are exemplary, wherein.

Figure 1:
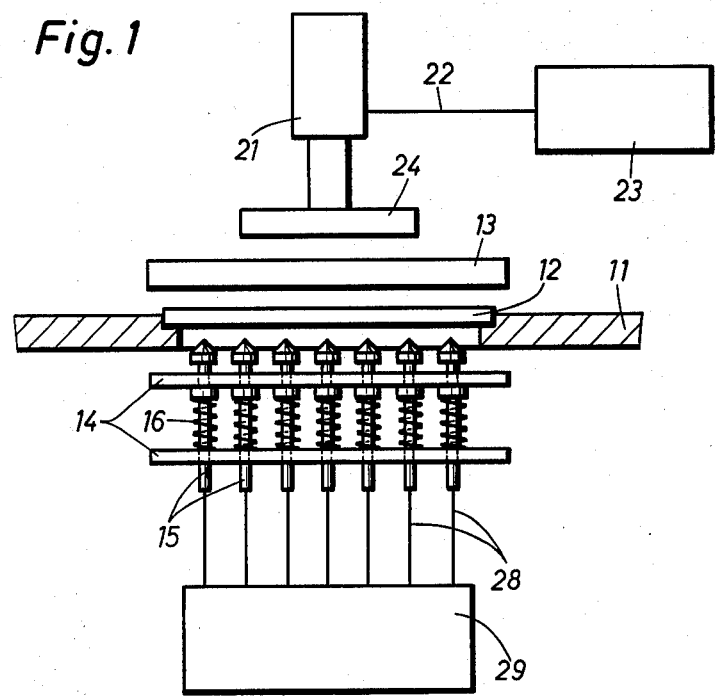
FIG. 1 is a schematic arrangement of the testing apparatus according to the present invention in position before the measuring pins are brought into engagement with the printed circuit.

As may be seen in FIG. 1, a test piece 12 which is in the form of a printed circuit board is positioned into a receiving plate 11 and secured in position by a pressure plate 13 which is preferably pneumatically displaceable toward and away from the printed circuit 12. A plurality of measuring pins 15 are resiliently mounted for axial movement in opposed openings of a pair of spaced guide plates 14 in which the openings are positioned in a grid pattern to define a matrix. Each pin is provided with a compression spring 16 so as to urge each pin with a relatively low static pressure 10-100 p per pin) against measuring points 19 on the printed circuit board 12. The printed circuit board is provided with a plurality of conductor paths 18 arranged in a known manner on a base board 17 and coated with a protective layer of lacquer or plastic or similar material. The measuring points 19 may constitute terminals of the several conductors 18 and may surround a bore or opening in the board 17 for the connection of an electrical component in a manner as known in the art.

A vibratory hammer or ram 24 is positioned on pressure plate 13 and is vibrated by means of an ultrasonic vibratory unit 21 which is energized through a conductor 22 by means of a generator 23.

Figure 2:
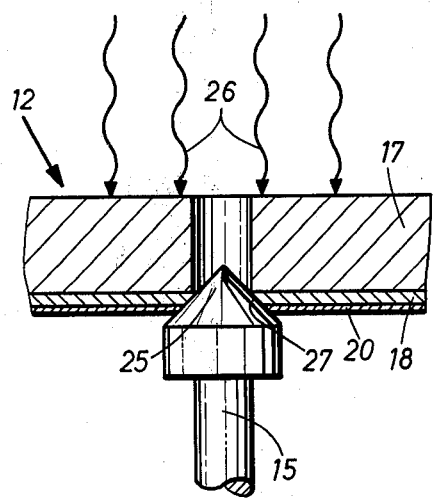
FIG. 2 is a side view in enlarged scale of the tip of a measuring pin in measuring position against a conductor of a printed circuit.

As may be seen in FIG. 2 each measuring pin 15 is provided with a tip 25 which in this embodiment has a rectangular conical shape so as to facilitate penetration through the lacquer coating 20.

Electrical conductors 28 lead from each of the measuring pins 15 to a control device 29 which evaluates measurements relating to the operational capacity of the test piece 12.

During the testing operation, the tips 25 of the measuring pins 15 are moved into the testing position as shown in FIG. 2 where they are in close contact with the material constituting the conductor path 18. The rammer 24 is then subjected to vibrations of about 20kHz as indicated by the wavy lines 26 shown in FIG. 2. This vibratory action occurs for a short period of time of about 0.2 seconds. The vibrations or impacts on the rammer 24 are then transmitted through the pressure plate 13 and test piece 12 to the resiliently urged measuring pins 15. Any impurities and/or oxides which might possibly exist on the measuring points 19 and which might exert a detrimental effect on the electrical connection or conductivity between tip 25 and measuring point 19 are thus removed together with the lacquer coating 20. As a result, there is obtained a pure metal to metal contact wherein any detrimental effects such as might be caused by burrs or scratches are largely eliminated.

In addition, a contact surface 27 is formed on the measuring tip 25 so as to define a cross-section of transition at this contact point between the conductor path 18 and the tip 25 so that high currents of the order of about 15 amps. can be employed for measurement and the electrical resistance is advantageously maintained at a relatively low level. The conctact surface 27 is precisely mechanically formed on the tip 25 and is dependent on the energy of the ultrasonic signal.

The various closed circuits thus formed according to FIG. 1 by means of good electrical contacts between the measuring pins 15 and the measuring points 19 lead to the control device 29 which evaluates the measurements according to predetermined standards so as to determine the operational capacity of the printed circuit.

The structural arrangement of this testing apparatus consists of a smaller number of components and can thus be made at a much lower cost than other known testing apparatus.

Figure 3:
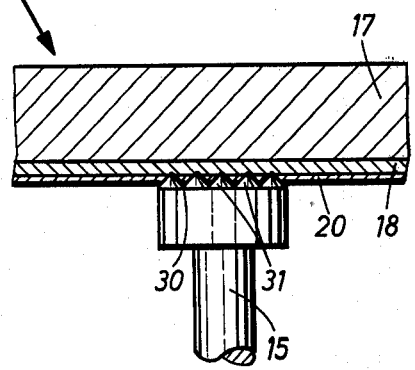
FIG. 3 is a view similar to that of FIG. 2 but showing a modification of the tip of the measuring pin.
Figure 4:
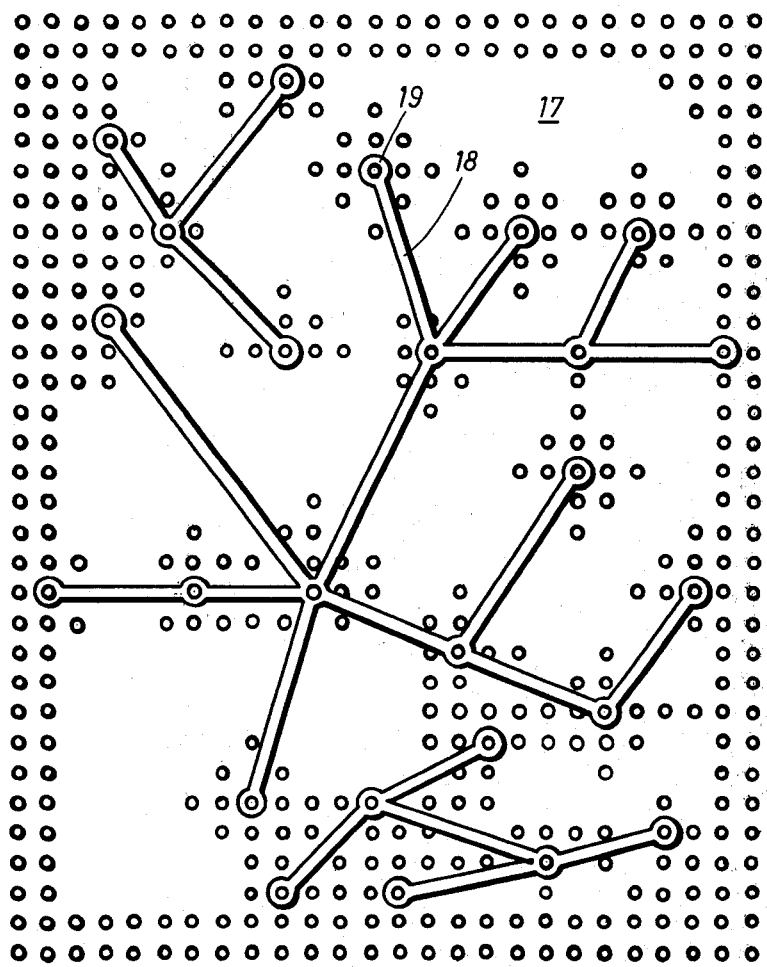
FIG. 4 is a plan view of an example of a printed circuit which can be tested according to the present invention.

In FIG. 3 there is shown a modification of the measuring pin 15 wherein the tip comprises a plurality of smaller pyramidshaped points or tips 31 arranged in the form of a grid on a surface 30 which is facing toward the test piece 12. The tips 31 provide optimum surface contact when establishing electrical contact with the plan conductor paths 18 or with the measuring points 19.

The effect of relatively large forces as obtained with relatively low static pressure by means of the ultrasonic emitter 23 can also be applied in the manner as described above to units of contact pins which may be connected to form larger units or disengage to form smaller units wherein the number of measuring pins is so great that it is difficult to gain access to the pins.

The present invention provides for obtaining a relatively low resistance to the flow of electrical current by the formation of the largest possible area of contact surface by a so-called mechanical forging or impacting process. The oscillation or vibratory effect of the present invention can be used not only for penetrating protective layers or coatings but also to forge the upper copper edges of the measuring points 19 which surround openings in the printed circuit board. This mechanical hammering or forging thus results in an increase in contact surface. The measuring pins themselves are not subjected directly to energy during this forging process but the test piece itself is energized and only the mass of the measuring pins which in themselves are inert is employed for the simultaneous penetration of the insulating layers with forging of the contact surfaces.

As disclosed above, an unlimited number of measuring or contact pins are thus displaced by means of the test piece which is subjected to a common source of energy.

The invention further provides for a higher density of arrangement of measuring pins since the measuring pins may be positioned closer together and a greater number of pins may be positioned over a unit area. The density of pins per unit area is limited only by the diameter of the pins themselves. With respect to the overall surface, the arrangement of pins can be expanded without any limit since no disrupting mechanical lever drives or other components are employed. Further, according to the present invention the measuring pins are automatically cleaned because of the acceleration to which the pins are subjected by means of the ultrasonic effect. Such cleaning of the pins is absolutely necessary for repeated testing operations if reliable results are desired.

The particular advantages of the present invention derive from the application of ultrasonic energy to a printed circuit which is being tested can be summarized as follows:

1. A positive reliable electrical connection between the printed circuit test piece and the moveable measuring pins since oxidation and other electrical resistance producing impurities are virtually eliminated.

2. Static pressure of the individual measuring pins is reduced to a minimum so that the measuring pins can be used in practically unlimited numbers.

3. A relatively large cross-section of electrically conducting surface is obtained by means of the precise fitting treatment of the corresponding contact surfaces. Thus the contact or measuring points can be subjected to high currents.

4. The invention is particularly suitable for mass production since the testing requires only a very short duration of time for each individual test operation.

5. The structure of the test apparatus is relatively low in cost and requires a considerably less space as compared with prior known testing structures.

The disclosed applications of the present invention constitute only a few of the possibilities to which the invention can be applied.

Other applications of the present invention will be readily apparent to those skilled in the art.

It will be understood that this invention is susceptible to modification in order to adapt it to different usages and conditions, and accordingly; it is desired to comprehend such modifications within this invention as may fall within the scope of appended claims.

What is claimed is:

1. In an apparatus for testing printed circuits, the combination of spaced guide plate means with opposed openings therethrough, a plurality of measuring pins mounted in said opposed openings for axial movement therein and resiliently urged to contacting positions by means of springs positioned between said spaced guide plate means and acting upon said pins, said pins having their tips engageable with metal points on a printed circuit to be tested and each pin tip comprising a conical point, means for supporting a printed circuit to be tested for engagement by the tips of said pins, and means including an ultrasonic vibratory unit acting upon said printed circuit for impacting the tips of the pins resiliently urged against the printed circuit upon points on said printed circuit which are to be tested to provide metal to metal contact between said points and said tips so as to obtain good electrical contact therebetween.

2. In an apparatus as claimed in claim 1 wherein the tips of said pins comprise a grid pattern of pyramid shaped points on a surface facing toward the printed circuit.

3. In an apparatus as claimed in claim 1 wherein the tip of a said pin comprises a plurality of points on a surface facing toward the printed circuit.

* * * * *